(12) United States Patent
Hunt

(10) Patent No.: US 11,482,090 B2
(45) Date of Patent: Oct. 25, 2022

(54) NEAR-FAR SECURITY SENSOR

(71) Applicant: Ecolink Intelligent Technology, Inc., Carlsbad, CA (US)

(72) Inventor: Brandon Hunt, Escondido, CA (US)

(73) Assignee: Ecolink Intelligent Technology, Inc., Carlsbad, CA (US)

( * ) Notice: Subject to any disclaimer, the term of this patent is extended or adjusted under 35 U.S.C. 154(b) by 44 days.

(21) Appl. No.: 16/786,403

(22) Filed: Feb. 10, 2020

(65) Prior Publication Data

US 2020/0175832 A1  Jun. 4, 2020

Related U.S. Application Data

(62) Division of application No. 15/671,288, filed on Aug. 8, 2017, now Pat. No. 10,565,843.

(51) Int. Cl.
| | |
|---|---|
| *G08B 13/24* | (2006.01) |
| *G08B 13/08* | (2006.01) |
| *G01R 33/07* | (2006.01) |
| *G01B 7/14* | (2006.01) |
| *G01R 33/00* | (2006.01) |
| *G01R 33/02* | (2006.01) |
| *G08B 21/22* | (2006.01) |
| *G08B 29/20* | (2006.01) |

(52) U.S. Cl.
CPC .......... *G08B 13/2491* (2013.01); *G01B 7/14* (2013.01); *G01R 33/0023* (2013.01); *G01R 33/02* (2013.01); *G01R 33/072* (2013.01); *G08B 13/08* (2013.01); *G08B 21/22* (2013.01); *G08B 29/20* (2013.01)

(58) Field of Classification Search
CPC .... G08B 13/2491; G08B 13/08; G08B 21/22; G08B 29/20; G01R 33/072; G01R 33/0023; G01R 33/02; G01B 7/14
See application file for complete search history.

(56) References Cited

U.S. PATENT DOCUMENTS

| | | | |
|---|---|---|---|
| 4,763,937 | A | 8/1988 | Sittnick |
| 6,196,037 | B1 | 3/2001 | Urschel et al. |
| 6,963,280 | B2 | 11/2005 | Eskildsen |
| 7,086,257 | B2 | 8/2006 | Bucket et al. |

(Continued)

FOREIGN PATENT DOCUMENTS

| | | |
|---|---|---|
| DE | 4113665 A1 | 11/1992 |
| JP | 5307607 B2 | 10/2013 |

OTHER PUBLICATIONS

ISA/US, International Search Report and Written Opinion issued on PCT application No. US17/17206, dated Apr. 17, 2017, 10 pages.

(Continued)

*Primary Examiner* — Farhana A Hoque
(74) *Attorney, Agent, or Firm* — Greenber Traurig, LLP

(57) ABSTRACT

Described is a security sensor comprising two or more sub-sensors for use in a variety of installations where different magnetic fields may be experienced by the security sensor as a result of the variety of installations. One of the sub-sensors may have a low magnetic sensitivity while the other sub-sensor may have a much higher sensitivity to magnetic fields. In operation, one or both sub-sensors are used to determine if a door or a window has been opened.

22 Claims, 4 Drawing Sheets

(56) References Cited

U.S. PATENT DOCUMENTS

| | | |
|---|---|---|
| 2005/0044908 A1 | 3/2005 | Min |
| 2007/0139183 A1 | 6/2007 | Kates |
| 2008/0018438 A1 | 1/2008 | Ehrlich et al. |
| 2008/0084299 A1 | 4/2008 | Fisher et al. |
| 2009/0300988 A1 | 12/2009 | Bem |
| 2010/0152947 A1 | 6/2010 | Denholm et al. |
| 2015/0348385 A1* | 12/2015 | Lamb .................. G08B 29/20 340/547 |
| 2016/0187118 A1 | 6/2016 | Modi |
| 2017/0236406 A1 | 8/2017 | Anderson et al. |

OTHER PUBLICATIONS

ISA/US, International Search Report and Written Opinion issued on PCT application No. US18/43808, dated Oct. 16, 2018, 16 pages.
EPO, Supplementary European Search Report issued on European patent application No. 18843401.3, dated Mar. 15, 2021, 14 pages.
Anonymous: "Magnetometer—Wikipedia", Mar. 14, 2021, 22 pages.

* cited by examiner

NEAR-FAR SECURITY SENSOR

CROSS-REFERENCE TO RELATED APPLICATIONS

This application is a divisional of U.S. patent application Ser. No. 15/671,288, filed on Aug. 8, 2017.

BACKGROUND

I. Field of Use

The present application relates to the field of home security. More specifically, the present application relates to a particular type of door or window sensor for use in home security applications.

II. Description of the Related Art

Security systems for homes and offices have been around for many years. Often, these systems make use of barrier alarms, such as door and window sensors, in communication with a centrally-located alarm panel. Door and window sensors typically comprise two distinct parts: a magnet and a reed switch assembly. The magnet is typically installed onto a movable part of a window or onto a door edge, while the reed switch is mounted to a stationary surface, such as a wall adjacent to a door or window frame. When the door or window is closed, the magnet and reed switch are in close proximity to one another, and a relatively strong magnetic field is sensed by the reed switch, causing the switch to maintain a first state indicative of a "no alarm" condition. If the door or window is opened, proximity is lost between the magnet and the reed switch, resulting in a loss of the magnetic field in proximity to the reed switch, thus causing the reed switch to change state, e.g., from closed to open or from open to closed. The change of state is indicative of a local alarm condition (i.e., unauthorized opening of a door or window), and a signal may be generated by circuitry located within the reed switch assembly and sent, via wires or over-the-air, to the alarm panel. Alternatively, or in addition, a loud audible alert is generated, either at the alarm panel in the home or directly by the circuitry within the reed switch assembly, indicating that a door or window has been opened without authorization.

One of the disadvantages of typical door and window sensors is that they are only able to operate in a "binary" fashion: the reed switch is either open or closed. Thus, prior art sensors are not capable of determining how far a door or window has been opened.

Another disadvantage of prior art door and window sensors is that they may be defeated by placing an external magnet in proximity to the reed switch, thus allowing a door or window to be opened without causing an alarm.

Yet another disadvantage of prior art door and window sensors is that they must typically be mounted so that they are in very close proximity to the magnet when a door or window is closed. This is sometimes problematic when wide door or window frames, casements, casings, or jambs are encountered. The relatively wide displacement between the sensor and magnet in these situations does not allow the reed switch to change state when a door or window is closed.

Thus, it would be desirable to overcome the shortcomings of the prior art to provide door and window sensors that can be used on wide variety of door/window frames, jambs, casements, or casings.

SUMMARY

The embodiments described herein relate to a near-far security sensor, and its operation, for monitoring a barrier, comprising a first sub-sensor for detecting a magnetic field produced by a magnet, second sub-sensor for detecting the magnetic field, a memory for storing processor-executable instructions, and a processor coupled to the first sub-sensor, the second sub-sensor and the memory for executing the processor-executable instructions that cause the near-far sensor to select one of the sub-sensors to monitor during a normal operating mode, monitor the selected sub-sensor during the normal operating mode, and determine whether the barrier has been opened based on either the first sub-sensor or the second sub-sensor, depending on which sub-sensor was selected.

In another embodiment, another embodiment of a near-far security sensor is described, comprising a reed switch sensor for detecting the presence of a magnetic field produced by a magnet when the barrier is closed, Hall Effect sensor for detecting the magnetic field when the barrier is closed, a transmitter, and a processor coupled to the reed switch, the Hall Effect sensor and the transmitter for selecting the reed switch sensor or the Hall Effect sensor switch for monitoring during a normal mode of operation, and monitoring the selected sensor during the normal mode of operation to determine when the barrier has been opened, and causing an alarm signal to be transmitted by the transmitter when the processor determines that the barrier has been opened.

In yet another embodiment, a method is described for operation of a near-far sensor, comprising determining, by a processor, when a first sub-sensor has detected a magnetic field produced by a magnet, determining, by the processor, when a second sub-sensor of the near-far security sensor has detected the magnetic field, selecting, by the processor, one of the sub-sensors to monitor based on which sub-sensor detected the magnetic field, monitoring the selected sub-sensor during a normal mode of operation, and determining whether the barrier has been opened when the selected sub-sensor indicates a change in the magnetic field.

BRIEF DESCRIPTION OF THE DRAWINGS

The features, advantages, and objects of the present invention will become more apparent from the detailed description as set forth below, when taken in conjunction with the drawings in which like referenced characters identify correspondingly throughout, and wherein.

DETAILED DESCRIPTION

The present description relates to a "near-far" door or window security sensor that can be used in installations where either a wide or a narrow door or window frame may be present. The near-far door or window security sensor comprises at least two sub-sensors. A first sub-sensor is used to detect relatively strong magnetic fields, such as magnetic field sensed from a standard magnet used in prior art door/window security sensors. A second sensor is used to detect relatively weak magnetic fields, also from a standard magnet, but positioned at a relatively far distance from the near-far sensor.

Figure 1:
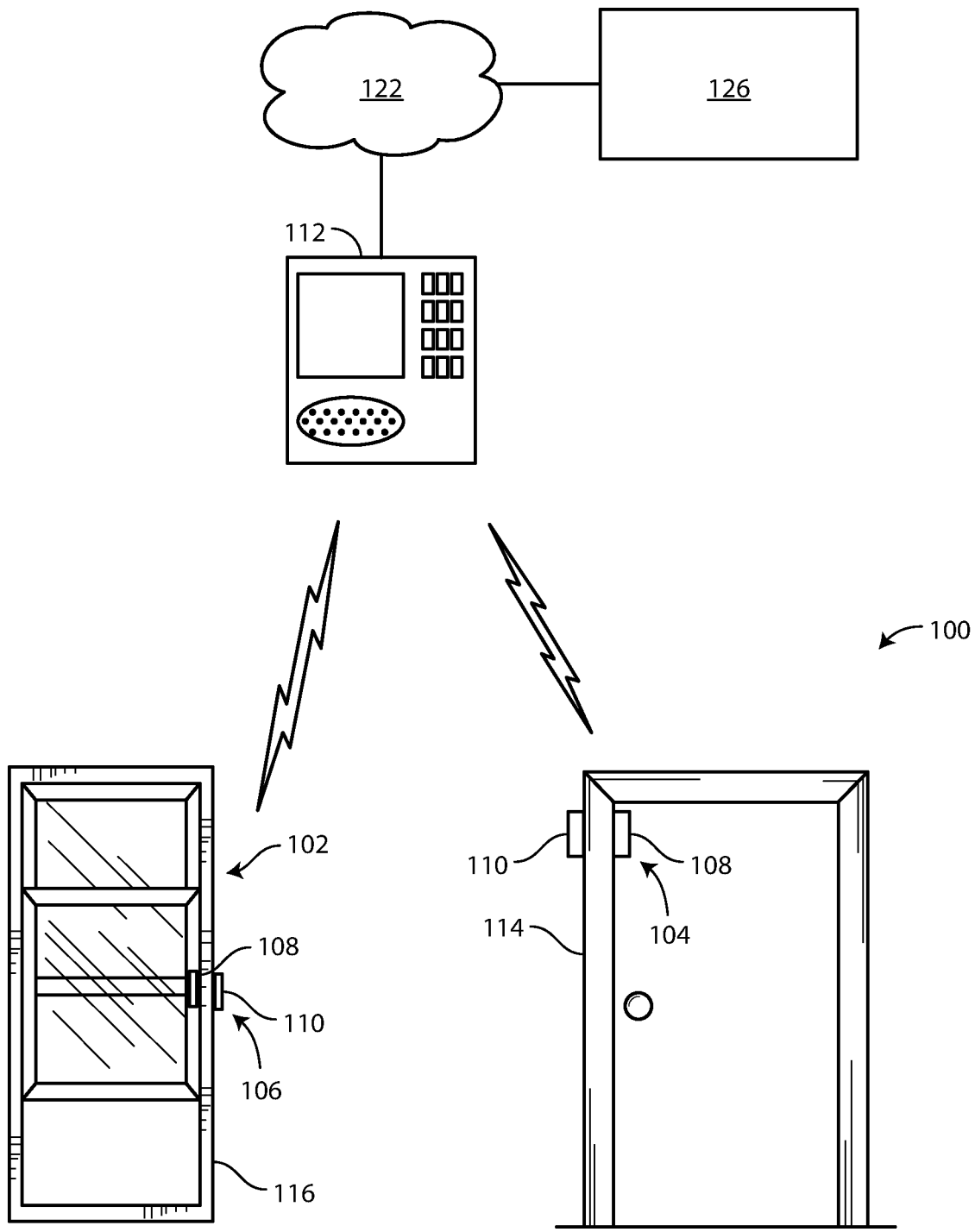
FIG. 1 is an illustration of a FIG. 1 is an illustration of a prior art security system.

FIG. 1 is an illustration of a prior art security system. A door 100 and a window 102 are monitored by barrier alarms (i.e., door/window sensors) 104 and 106, respectively. Each of the barrier alarms comprises a magnet 108 and a sensor 110. Magnet 108 is shown in FIG. 1 as mounted on a movable portion of door 100 and window 102, while sensor 110 is mounted on a wall on the other side of door jamb 114 and casing 116, in proximity to magnet 108 when door 100 or window 102 is in a closed position. However, in other embodiments, magnet 108 may be mounted to the wall and sensor 110 mounted to the movable door or window portion. Sensor 110 detects a magnetic field produced by the magnet and uses this detection as a basis for determining whether the door 100 or window 102 is open, closed, partially open, or transitioning between any of these states.

Each of the barrier alarms communicate with alarm panel 112, typically using wireless RF signals generated by the barrier alarms and/or alarm panel 112. For example, if door 100 is opened, sensor 108 detects a reduction or elimination of a magnetic field produced by magnet 108 as magnet 108 moves away from sensor 108 as door 100 is opened. In response, barrier alarm 104/106 generates and transmits an alarm signal to alarm panel 112 indicative of a local alarm condition, e.g., door 100 has been opened.

In some embodiments, alarm panel 112 may send messages to either of the barrier alarms requesting a status of either one, e.g., whether a barrier being monitored is "open", "closed", partially open, a battery status, a tamper status, etc. In response, one or both barrier alarms may transmit a response to alarm panel 112 indicating such a status, as the case may be. Other commands may be transmitted by alarm panel 112, such as "sound alarm", "turn on warning light", open gate, lock door, unlock window, etc.

As described above, alarm panel 112 performs monitoring of barrier alarms 104, 106, and other security devices (for example, tilt sensors, shock sensors, motion detectors, passive infra-red detectors, light interruption detectors, etc.) that may be part of the security system. In addition, alarm panel 112 may provide an audible and/or visual status of the various sensors in the system (e.g., "open", "closed", "partially open", "open more than X distance", "on", "off", "normal", "alarm", "locked", "unlocked", etc.).

Alarm panel 112 may also be in communication with an off-site remote monitoring station 124 via communication network 122, such as the Internet, PSTN, a fiber optic communication network, a wireless communication network (e.g., cellular, data, satellite, etc.), and/or other wide-area network. Remote monitoring station 124 typically provides security monitoring services for homes and businesses equipped with security systems such as the one shown in FIG. 1. Remote monitoring station 124 is adapted to receive communications from alarm panel 112 via network 122 in response to alarm panel 112 receiving an indication of a local alarm condition being sensed by one or more barrier alarms/sensors in the security system. In other embodiments, alarm panel 112 simply receives raw data from the barrier alarms and determines, based on the data, whether a local alarm condition has occurred. When a local alarm condition is detected, alarm panel 112 generates a system alarm which may comprise taking one or more actions, such as notifying remote monitoring station 124 that a local alarm condition has occurred, illuminating one or more lights, sounding one or more audible alerts, etc.

Alarm panel 112 may be operated via voice commands, a keypad, or a touchscreen which allows users to enter and receive information to/from alarm panel 112. Users may, alternatively or in addition, provide information to, and receive information from, alarm panel 112 via a wireless communication device, such as a smartphone, tablet computing device, or other mobile computing device, and/or a fixed remote device, such as a desktop computer or remote keypad/touchscreen device in communication with alarm panel 112 either directly, or through a gateway device in communication with alarm panel 112 and network 122.

Figure 2:
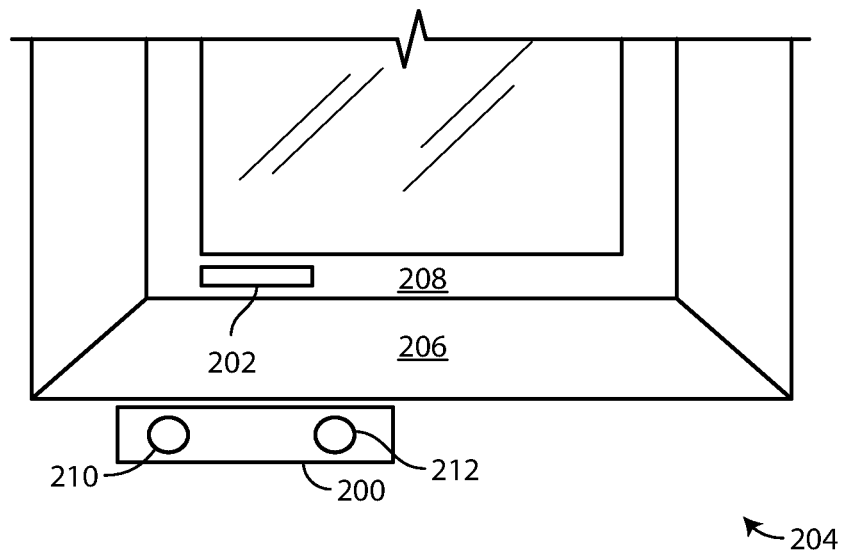
FIG. 2 is a close-up view of one embodiment of a barrier alarm mounted to a window having a wide casing, for monitoring a status of a door or a window, in accordance with the principles of described herein.
Figure 3:
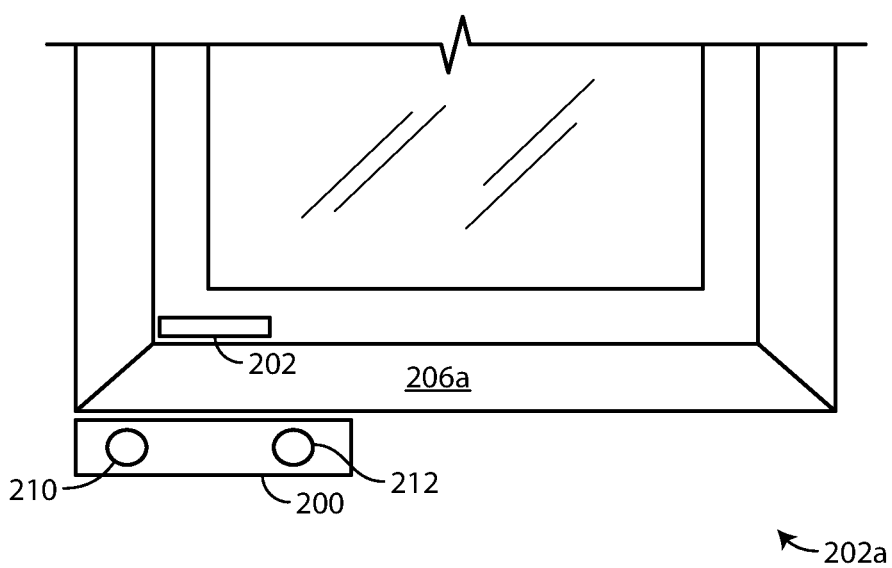
FIG. 3 is a close-up view of the barrier alarm of FIG. 2 mounted to a window having a narrow casing.

FIG. 2 is a close-up view of one embodiment of a "near-far" barrier alarm comprising near-far sensor 200 and magnet 202 for monitoring a status of a door or a window, in accordance with the principles of described herein. In this example, the barrier alarm monitors a window 204. Here, the window 204 comprises a four inch wide window casing 206, such that near-far sensor 200 is mounted to the wall on one side of the window casing 206, while magnet 202 is located on a movable portion 208 of the window 202, as shown. In this installation, when the movable portion 208 is closed, the magnetic field in the vicinity of near-far sensor 200 is less than the magnetic field would be if near-far sensor 200 was mounted closer to the magnet, such as the case shown in FIG. 3. In this figure, the same near-far sensor 200 and magnet 202 are mounted on another window 202a, this window 202a having a window casing 206a that is more narrow than the one shown in FIG. 2, for example, one inch wide. The magnetic field in the vicinity of near-far sensor 200 in this case is stronger than the magnetic field in the vicinity of near-far sensor 200 shown in FIG. 2, because magnet 202 and near-far sensor 200 in FIG. 3 are closer together than magnet 202 and near-far sensor 200 in FIG. 2. Other physical properties could also affect the magnetic field in the vicinity of near-far sensor 200, including the type (i.e., material) and density of casing 206/206a, the depth of casing 206/206a, or an external object such as a metal bookshelf or metal art piece placed in the vicinity of near-far sensor 200.

Near-far sensor 200 may comprise a user input device 210 for providing a signal to a processor within near-far sensor 200 to enter a configuration mode of operation, as opposed to a normal mode of operation where near-far sensor 200 normally operates to determine when a door or window that it is monitoring has been opened. In one embodiment, user input device 210 may be used to place near-far sensor 200 into a calibration mode of operation as well. Such a user input device 210 may comprise a mechanical switch (i.e., pushbutton, momentary pushbutton, toggle, slide, etc.), an opto-electrical switch, a heat sensing device (to detect the presence of a human finger), a capacitive sensor, a microphone, or any other type of switch or sensor to provide an indication to near-far sensor 200 that a user wishes to place near-far sensor 200 into a configuration mode or a calibration mode, and/or to provide signals to the processor within near-far sensor 200 indicating that the window (or door) is in a certain position during a calibration process, for example, closed, open, partially open, opened a predetermined distance (for example, 6 inches, allowing air to enter the window or door, but not enough for a person to pass).

Status indicator 212 may additionally be used to convey the status of barrier alarm as being armed or disarmed, the term "armed" referring to an ability to detect and/or report an event (e.g., movement of a door or window, closing/ opening of a door or window, door or window being in a certain state, such as open or closed, etc.), and the term "disarmed" referring to a condition where the barrier alarm cannot detect and/or report an event. Further, status indicator 212 may provide an indication to a user that near-far sensor 200 has accepted input from the user, such as after the user has entered the calibration mode by blinking repeatedly. Still further, status indicator 212 may provide an indication to a user that near-far sensor 200 is ready for the user to take some action, such as progressing to a next step in a calibration procedure. Status indicator 212 may comprise an LED, LCD, or any other device for providing a visual status of the barrier alarm, or it may comprise a device capable of emitting audible tones, messages, alerts, etc., that also indicate a status of the barrier alarm. In one embodiment, indicator 212 comprises a multi-color LED, for example an LED package that is able to produce red light and a green light, red for indicating that the barrier alarm is disabled and green for indicating that the barrier alarm is armed. Of course, other colors may be used to differentiate between an armed and unarmed condition. In other embodiments, two or more visual indicators may be used to convey status.

In one embodiment, in the configuration mode of operation, near-far sensor 200 programs itself to use one of two sub-sensors inside near-far sensor 200. For example, a first sub-sensor inside near-far sensor 200 may comprise a first magnetic field detector having a first magnetic field sensitivity and a second magnetic field detector having a second magnetic field sensitivity, where the magnetic sensitivity of one sub-sensor is much greater than the other sub-sensor, for example, five times or more as sensitive. In other embodiments, the sensitivity difference between the sub-sensors may be as much as one thousand times or even greater. One of the sub-sensors is selected for use to detect when a door or window has been opened so that an alarm signal can be sent to panel 112 (i.e., in the normal mode of operation). In one embodiment, selection occurs in the configuration mode by opening and closing a door or a window. If magnet 202 is relatively close to near-far sensor 200, such as shown in FIG. 3, then the magnetic field sensed by both sub-sensors is relatively strong, for example, on the order of 20 Gauss or so, and both sub-sensors are likely to detect the relatively strong magnetic field. The exact strength of the magnetic field near sensor 200 will vary depending on factors such as magnet size and type and the width and material of a door or window casing. In one embodiment, when both sub-sensors detect the presence of a magnetic field, the first sub-sensor (having a reduced magnetic field detection sensitivity) is selected for monitoring by the processor in the normal mode of operation, and the second sub-sensor is ignored. Monitoring may comprise polling the selected sub-sensor at predetermined time intervals or providing an interrupt to the processor.

In another embodiment, near-far sensor 200 may be configured without the use of a configuration mode. In this embodiment, after an initial power-on by a user, near-far sensor 200 simply monitors both sub-sensors and as the near-far sensor 200 operates in a normal mode, but stops monitoring one of the sub-sensors after a predetermined time period, or a predetermined number of door/window openings have been detected (the "introductory time period"). In other words, one of the sub-sensors is selected for continuing operation by determining which sub-sensor has changed states at least one time after expiration of the predetermined time period or the predetermined number of door/window openings have been met, and the other sub-sensor is not monitored after the introductory period.

In other embodiments, one of the sub-sensors is selected as a primary sub-sensor, and the other sub-sensor may be monitored as a secondary sub-sensor. In this embodiment, the primary sub-sensor may be polled at a predetermined time interval, while the secondary sub-sensor may be polled at a different predetermined time interval far greater than the time interval for polling the primary sub-sensor. For example, the primary sub-sensor may be polled at a rate of once per second, while the secondary sub-sensor may be polled at a rate of once per minute. Polling both sub-sensors may be beneficial to detect abnormal conditions, such as tampering with near-far sensor 200, for example, by placing a strong magnet in the vicinity of near-far sensor 200, which would cause both sub-sensors to sense a magnetic field generated by the strong magnet. This may be an indication that an anomaly is occurring in the vicinity of near-far sensor 200, such as a burglar trying to defeat near-far sensor 200 by maintaining the position of the primary sub-sensor, which may comprise a reed switch.

While in the configuration mode or, alternatively, when placed into a calibration mode of operation, near-far sensor 200 may perform a calibration routine to set one or more magnetic-based thresholds for use in determining if a door or window has been opened, and/or how far a door or window has been opened. Further details of this calibration are provided later herein.

Figure 4:
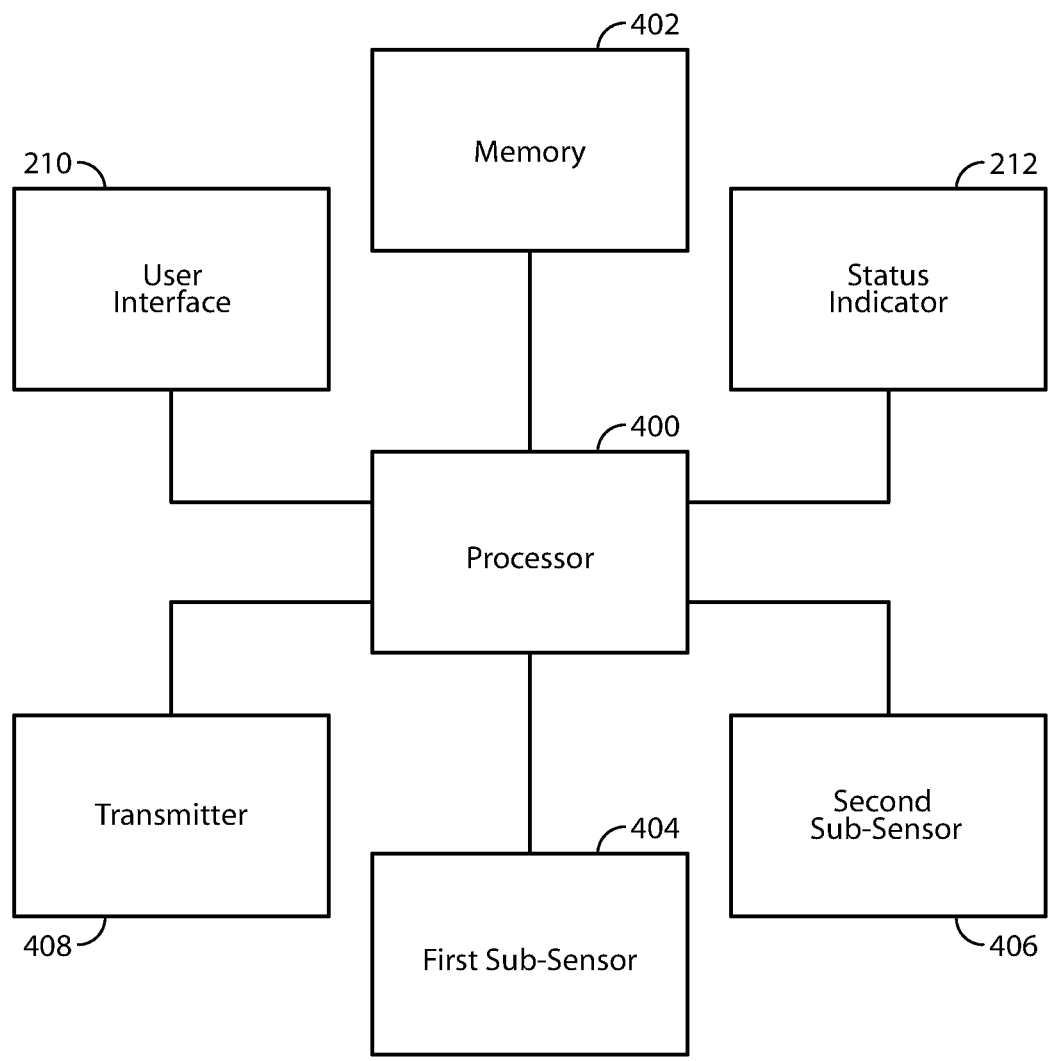
FIG. 4 is a functional block diagram of one embodiment of the barrier alarm shown in FIGS. 2 and 3.

FIG. 4 is a functional block diagram of one embodiment of near-far sensor 200. Specifically, FIG. 4 shows processor 400, memory 402, first sub-sensor 404, second sub-sensor 406, transmitter 408, user interface 210, and status indicator 212. It should be understood that not all of the functional blocks shown in FIG. 4 are required for operation of the barrier alarm (for example, status indicator 212 may not be present), that the functional blocks may be connected to one another in a variety of ways, and that not all functional blocks are necessary for operation of the barrier alarm are shown (such as a power supply), for purposes of clarity.

Processor 400 is configured to provide general operation of near-far sensor 200 by executing processor-executable instructions stored in memory 402, for example, executable code. Processor 400 typically comprises a general purpose microprocessor or microcontroller able to fit within the housing of near-far sensor 200, while consuming very little power, enabling near-far sensor 200 to operate for many months or years before battery replacement becomes necessary. Such a processor 400 may comprise an ADuC7024 microcontroller manufactured by Analog Devices, Inc. of Norwood Massachusetts, although any one of a variety of microprocessors, microcomputers, and/or microcontrollers may be used alternatively.

Memory 402 comprises one or more non-transitory information storage devices, such as RAM, ROM, EEPROM, UVPROM, flash memory, SD memory, XD memory, or other type of electronic, optical, or mechanical memory device. Memory 402 is used to store processor-executable instructions for operation of barrier alarm 104 or 106, as well as any information used by processor 400, such as threshold information, parameter information, identification information (e.g., sensor serial number), current or previous door or window status information, audible or visual alerts for driving status indicator 212, etc. Memory 402 excludes media for propagating signals.

First sub-sensor 404 is coupled to processor 400 and senses one or more attributes of a magnetic field produced by magnet 202. For example, first sub-sensor 404 may detect the strength, direction, and/or polarity of the magnetic field produced by magnet 202, in one or more axis, and produce a signal in accordance with one or more of these properties. An example of such a first sub-sensor 404 is a typical reed switch, used in the security industry for many years. Typically, in order to change the state of a typical reed switch used in prior art security sensors, a certain threshold magnetic field is needed, which is a relatively strong magnetic field strength. The measure of the magnetic field strength required to operate a reed switch is generally expressed in ampere turns. The relationship between magnet strength (measured in gauss or Tesla) and reed switch sensitivity (measured in ampere-turns) to the corresponding activation distance depends on the magnet size, shape, and material, as well as the size and modification (if any) of the reed switch. The orientation of the magnet relative to the reed switch may also be very important. Magnets are manufactured to feature-specific gauss strength. Magnet shape and size dictates how strong the magnetic field is at a specific distance from the magnet. In many motion and/or proximity sensor (reed switch in a housing) applications it is known how much gauss is available to activate the switch. In general, there may exist a linear relationship between Gauss and Ampere Turn such that, in one embodiment, 0.1 milli-Tesla (mT) is equivalent to 1 Gauss, which is equivalent to 1 ampere turn. Thus, first sub-sensor 404 has limited sensitivity in that it is selected to detect only a relatively strong magnetic field, i.e., the strength of a magnetic field sensed when a magnet is brought in close proximity to near-far sensor 200, as in FIG. 3.

Second sub-sensor 406 is coupled to processor 400 and also senses one or more attributes of a magnetic field produced by magnet 202. For example, second sub-sensor 406 may detect the strength, direction, and/or polarity of the magnetic field produced by magnet 202, in one or more axis, and produce a signal in accordance with one or more of these properties. However, second sub-sensor is selected to have a much greater sensitivity to magnetic fields than first sub-sensor 404. An example of such a second sub-sensor 406 is a Hall Effect sensor, a magneto resistor, a magneto-diode, a magneto-transistor, a magneto-optical sensor, a Lorentz force based MEMS sensor, a MEMS compass, or any other magnetic sensor that detects changes in a magnetic field, excluding reed switches. Typically, second sub-sensor 406 outputs a digital signal indicative of the strength of a sensed magnetic field. Second sub-sensor 406 is selected for use by processor 400 when the magnetic field at near-far sensor 200 is not strong enough for first sub-sensor 404 to detect, for example, in installations as shown in FIG. 2. Typical examples of second sub-sensor 406 is an MLX90393 Hall Effect sensor manufactured by Melexis of Ypres, Belgium, or a ZMY20 magnetic field sensor manufactured by Diodes Incorporated of Dallas, Tex.

Transmitter 408 comprises circuitry necessary to wirelessly transmit alarm signals and other information from near-far sensor 200 to alarm panel 112, either directly or through in intermediate device, such as a repeater, commonly used in popular wireless mesh networks such as Z-wave or Zigbee networks. Such circuitry is well known in the art and may comprise BlueTooth, Wi-Fi, RF, optical, ultrasonic circuitry, among others. Alternatively, or in addition, transmitter 408 comprises well-known circuitry to provide signals to alarm panel 112 via wiring, such as telephone wiring, twisted pair, two-conductor pair, CAT wiring, AC home wiring, or other type of wiring.

User interface 210 is used to provide user input to processor 400. For example, user interface 210 may allow a user to signal processor 400 that the user is ready to being the configuration and/or calibration process, to "arm" or "disarm" near-far sensor 200, to alert processor 400 to when a step in a calibration process has been completed (e.g., window/door has been opened/closed fully), etc. User interface 210 may comprise, simply, of a mechanical switch (e.g., pushbutton, momentary pushbutton, toggle, slide, etc.), opto-electrical switches, heat sensing devices (to detect the presence of a human finger), capacitive sensors, or any other type of switch or sensor to provide user input to processor 400.

Status indicator 212 is used to convey the status of the near-far sensor 200 (e.g., "armed", "disarmed", etc.) and/or to provide sensor status to a user during, for example, the configuration and/or calibration process, such as "open window/door fully", "close window/door fully", "open window/door to a desired point", configuration/calibration complete, etc. Status indicator 212 may comprise one or more LEDs, LCDs, or any other device for providing a visual status of the near-far sensor 200, or it may comprise a device capable of emitting audible tones, messages, alerts, etc., that also indicate a status of the near-far sensor 200 and/or a monitored door or window. In one embodiment, indicator 212 comprises a multi-color LED, for example an LED package that is able to produce red light and a green light, red for indicating that near-far sensor 200 is disabled and green for indicating that near-far sensor 200 is armed. Of course, other colors may be used to differentiate between an armed and unarmed condition. In other embodiments, two or more visual indicators may be used to convey status.

In normal operation, processor 400 executes processor-executable instructions stored in memory 402 that causes the near-far sensor 200 to monitor information provided by first sub-sensor 404 and/or second sub-sensor 406 for changes in a magnetic field sensed by the sub-sensors, indicative of a monitored door or window being opened or closed. If processor 400 determines that a monitored door or window has been opened as a result of monitoring first sub-sensor 404 and/or second sub-sensor 406, processor 400 generates an alarm signal and provides the alarm signal to transmitter 408 for transmission to alarm panel 112. In one embodiment, the alarm signal comprises a notification to alarm panel 112 that a local alarm condition has been detected by near-far sensor 200.

The processor-executable instructions stored in memory 402 also comprise instructions for processor 400 to enter into a configuration and/or calibration mode, as described earlier.

Figure 5:
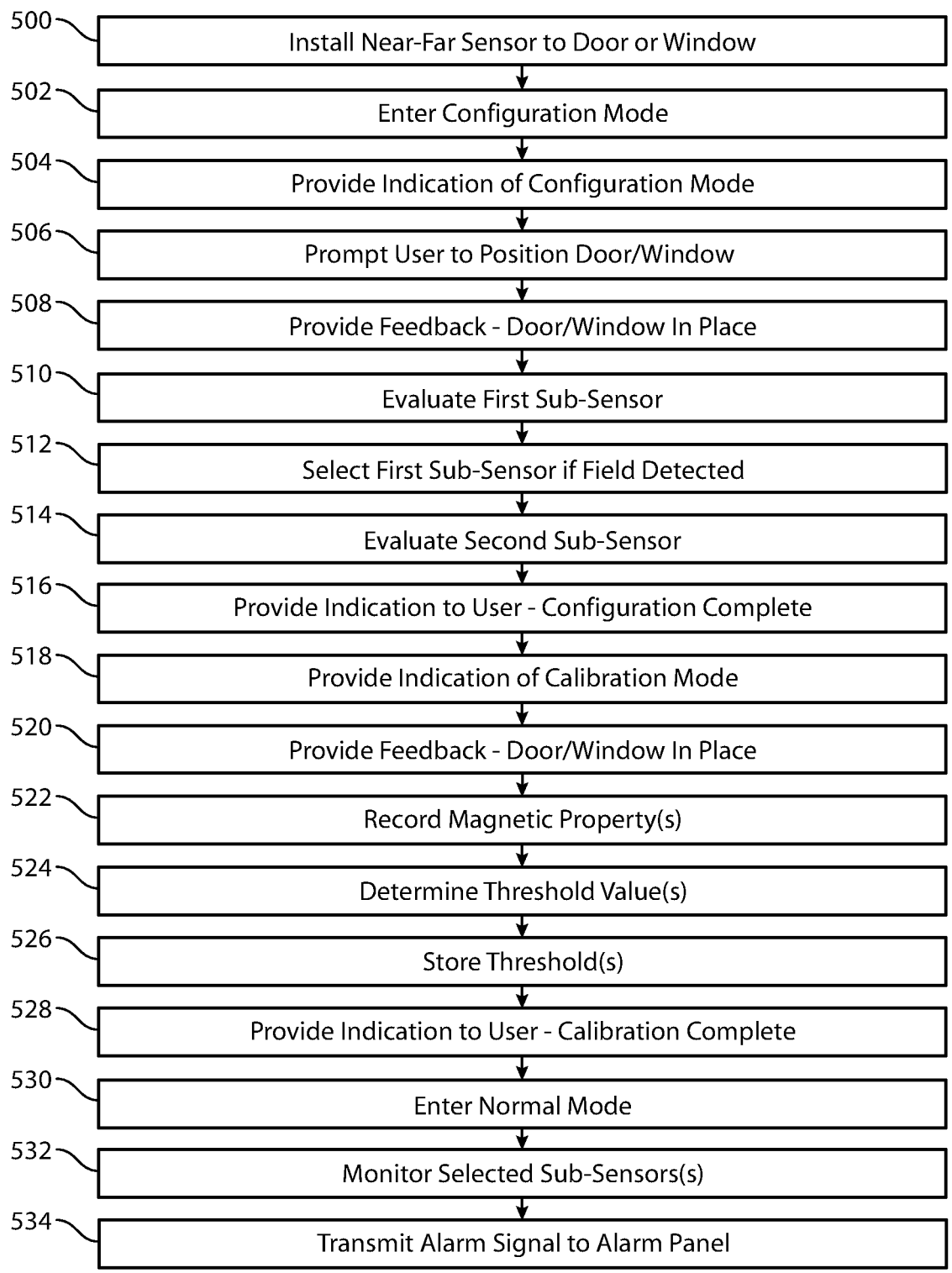
FIG. 5 is a flow diagram illustrating one embodiment of a method performed by the near-far sensor sown in FIGS. 2 and 3.

FIG. 5 is a flow diagram illustrating one embodiment of a method performed by near-far sensor 200. It should be understood that in some embodiments, not all of the steps shown in FIG. 5 are performed. It should also be understood that the order in which the steps are carried out may be different in other embodiments.

At block 500, near-far sensor 200 is physically installed onto a movable portion of a door or window, or installed on a wall adjacent to a door jamb or window casing of a door or window to be monitored. Magnet 202 is installed onto either the door or window movable portion, or to the wall adjacent to the door jamb or window casing, depending on where the near-far sensor 200 is located. When near-far sensor 200 is powered on, typically by a battery internal to near-far sensor 200, near-far sensor 200 may automatically enter a configuration mode of operation upon an initial power-on. Alternatively, near-far sensor 200 begins an "introductory period" by monitoring both sub-sensors 404 and 406 for a predetermined time period or a predetermined number of detected door or window openings.

At block 502, near-far sensor 200 enters the configuration mode, which should be noted is different than a calibration mode. In the configuration mode, one or both sub-sensors are selected for monitoring by processor 400 based in signals received from the sub-sensors as a user places a monitored door or window into various positions, such as fully open, fully closed, partially open, etc. Calibration, on the other hand, is generally about setting thresholds for certain events to occur. In the present context, calibration may refer to measuring magnetic field properties at various door or window settings and comparing future readings to the measured properties to make determinations, such as whether a door or a window has been opened. As for the configuration mode, a user might press a button located on near-far sensor 200 for a predetermined time period, such as three seconds, in order to initiate such a mode. In another embodiment, the calibration mode may be entered automatically after a battery is first installed and/or near-far sensor 200 turned on for the first time.

At block 504, processor 400 may provide a signal to status indicator 212, causing status indicator 212 to provide an audio and/or visual indication to the user that near-far sensor 200 has successfully entered the configuration mode.

At block 506, the user may be prompted to position the movable portion of a door or window into a first position, such as a closed position or an open position, by status indicator 212. For example, status indicator 212 could emit a red light as a prompt for the user to open the door or window to a certain position, such as a maximum open position, or a position where magnet 202 will be located far enough from near-far sensor 200 that the magnetic field in the vicinity of sensor 100 is minimal.

After the user has placed the door or window into the first position, the user may provide an indication to processor 400 via user interface 210 that the door or window has been placed into the first position, at block 508. For purposes of discussion, it will be assumed that a window has been placed into a closed position, thereby positioning magnet 102 in proximity to near-far sensor 200. The user may provide such indication to processor 400 using user interface 210, i.e., by pressing a button, which generates a signal that is received by processor 400. In another embodiment, processor 400 automatically determines that the door or window has been placed into the first position by determining that the magnetic field sensed by first sub-sensor 404 and second sub-sensor 406 has remained stable for a predetermined time period, such as five seconds.

At block 510, processor 400 evaluates a signal from first sub-sensor 404 to determine if first sub-sensor 404 has detected the magnetic field produced by magnet 102 when the door or window is closed. In one embodiment, the first sub-sensor is not as sensitive to magnetic fields as the second sub-sensor, so if the first sub-sensor 404 is able to detect a magnetic field with the door or window in the closed position, there is generally no need to even consider whether sub-sensor 406 has sensed the magnetic field, because it likely has, due to its increased sensitivity over sub-sensor 404. Processor 400 may record a value provided by the first sub-sensor in in memory 402 for later reference, i.e., a "1" or a "zero", a multi-bit digital value, a digital value representing an analog voltage, frequency, or current, etc.

In one embodiment, memory 402 stores a preselected order in which processor 400 evaluates signals from each of the sub-sensors when near-far sensor 200 is placed into the configuration mode. For example, memory 402 may store an identity of first sub-sensor 404, which indicates to processor 400 that first sub-sensor 404 should be checked first during the configuration mode.

At block 512, when first sub-sensor 404 is able to detect the magnetic field from magnet 102, processor 400 selects first sub-sensor 404 as the sub-sensor to use while in the normal mode, and processor 400 stops monitoring second sub-sensor 406. Then, while in the normal mode of operation, processor 400 monitors only first sub-sensor 404 to determine if the monitored door or window has been opened. In one embodiment, processor 400 determines that first sub-sensor 404 has detected the magnetic field when the state of first sub-sensor 404 changes state from open to closed or closed to open, such as in the case where first sub-sensor 404 comprises a reed switch. In other embodiments, where first sub-sensor 404 does not comprise a reed switch, processor 400 determines that first sub-sensor 404 has detected the magnetic field when the signal from first sub-sensor 404 changes measurably, or changes more than a predetermined threshold.

At block 514, if first sub-sensor 404 does not detect the magnetic field, as determined by processor 400, processor 400 evaluates a signal from second sub-sensor 406 to determine if second sub-sensor 406 has detected the magnetic field. If second sub-sensor 406 has detected the magnetic field, processor selects second sub-sensor 406 as the sub-sensor to use while in the normal mode, and processor 400 stops monitoring first sub-sensor 404. Then, while in the normal mode of operation, processor 400 monitors only second sub-sensor 406 to determine if the monitored door or window has been opened. In one embodiment, processor 400 determines that second sub-sensor 406 has detected the magnetic field when the signal from second sub-sensor 406 changes measurably, or changes more than a predetermined threshold, or when a value from second sub-sensor 406 is greater or less than a predetermined threshold, which may be pre-stored in memory 202 during manufacture of near-far sensor 200. In any case, processor 400 may record a value provided by second sub-sensor 406 in in memory 402 for later reference, i.e., a "1" or a "zero", a multi-bit digital value, a digital value representing an analog voltage, frequency, or current, etc. Further, processor 400 may calculate a threshold variance of allowed values from the second sub-sensor and store the threshold variance in memory, along with the measured value at the time processor 400 determined that second sub-sensor 406 has detected the magnetic field. The threshold variance may comprise a fixed or variable percentage of the value measured by processor 400 during this state of the configuration process. For example, if second sub-sensor 406 comprises a Hall Effect sensor reading 812 on a scale between 0 and 1023, this may signify detection of the magnetic field by the Hall Effect sensor, and processor 400 may compare the reading to a threshold value stored in memory in order to determine that the magnetic field has been detected. Then, processor may take a percentage of the reading, such as 90%, as a threshold variance, and store the threshold variance in memory 402. Thereafter, in the normal mode, processor 400 will determine that the window is in the closed position by comparing readings of the Hall Effect sensor to 90% of 812, or 731 as the threshold variance, to determine that the window is closed. Any reading less than the threshold variance would indicate that magnet 102 has been moved far enough from near-far sensor 200 as to indicate that the door or window has been opened.

In one embodiment, processor 400 may evaluate both first sub-sensor 404 and second sub-sensor 406 in order to determine which sub-sensor to monitor during normal operation. Processor 400 selects one of the sub-sensors depending on which one detected the magnetic field from magnet 102 when the monitored door or window was placed in the closed position. If both sub-sensors detect the magnetic field, processor 400 may be pre-programmed to select one of the sub-sensors, such preselection based on one or more factors such as power consumption of each sub-sensor, reliability, etc. Then, in normal operation, processor 400 monitors the selected sub-sensor and ignores the non-selected sub-sensor. In any case, processor 400 may record the values provided by each of the sub-sensors in memory 402 for later reference.

In other embodiments, processor 400 performs a sub-sensor selection process as just described, but rather than ignore the non-selected sub-sensor, processor 400 may monitor the output of the non-selected sensor to provide additional operational benefits. For example, if first sub-sensor 404 comprises a reed switch and second sub-sensor 406 comprises a Hall Effect sensor, if processor 400 selects the reed switch for monitoring in the normal mode, processor 400 may periodically evaluate signals from the Hall Effect sensor too, in order to determine if tampering may be occurring by someone holding a very strong magnet in the vicinity of near-far sensor 200. Prior art reed switch security sensors have been known to be disabled by the presence of strong magnets as the strong magnetic field from these strong magnets prevents the reed switch from changing state when meant 102 is moved away from a traditional door/window sensor as a door or window is opened by an unauthorized party, such as a burglar. By periodically evaluating the signal from the Hall Effect sensor, processor 400 may be able to determine when such tampering is present, as the signal from the Hall Effect sensor will tend to be much different than the reading when only magnet 102 is in proximity to near-far sensor 200 when the door or window is in the closed position. Processor 400 may monitor the Hall Effect sensor at predetermined time intervals much less frequent that a predetermined time interval for monitoring the reed switch. For example, processor 400 may monitor the output of the reed switch ever second, while only monitoring the Hall Effect sensor once every 10 seconds. One reason to monitor the Hall Effect sub-sensor much less frequently than the reed switch is that the Hall Effect sub-sensor typically consumes far more power than the reed switch. Therefore, the Hall Effect sub-sensor is monitored much less frequently, but often enough to detect the placement of a strong magnet and the requisite time it would take for an unauthorized person to open, and then enter, the monitored door or window.

Similarly, when processor 400 selects the Hall Effect sensor during the configuration mode, processor 400 may monitor both the Hall Effect sensor and the reed switch during the normal mode. Again, this may be a way for processor 400 to determine whether tampering is occurring. If a strong magnet is brought in proximity to near-far sensor 200, the Hall Effect sensor may not register a difference in the magnetic field sensed by the Hall Effect sensor, because it is typically so sensitive, a very strong magnetic field may cause its output to "freeze". However, by monitoring the output of the reed switch at a predetermined time interval much greater than the time interval preselected to monitor the Hall Effect sensor, processor 400 may determine that the reed switch has changed state and, in response, send a signal to alarm panel 112, indicative of an anomaly. In a related embodiment, the predetermined time interval for monitoring the reed switch may be the same as the predetermined time interval to monitor the Hall Effect sensor, since checking the reed state typically draws very little energy. In another related embodiment, processor 400 does not check the state of the reed switch periodically. Rather, an interrupt is generated within processor 400 when the signal from the reed switch changes state.

At block 516, processor 400 may cause indicator 212 to provide an indication that processor 400 successfully selected one or both sub-sensors for monitoring during the normal mode of operation.

At block 518, processor 400 may cause indicator 212 to provide an indication that a calibration mode of operation has been entered into after selection of one or both sub-sensors has been completed in the configuration mode. The indication may prompt a user to fully open the door or window fully so that the magnetic field in the vicinity of one or both sub-sensors may be measured with minimal effect from magnet 102.

At block 520, after the user has placed the door or window into the fully open position, the user may provide an indication to processor 400 via user interface 210 that the door or window has been placed into the fully open position. The user may provide such indication to processor 400 using user interface 210, i.e., by pressing a button, which generates a signal that is received by processor 400. In another embodiment, processor 400 automatically determines that the door or window has been placed into the fully open position by determining that the readings from one or both sub-sensors has remained "steady" for a predetermined time period, such as five seconds.

At block 522, processor 400 records one or more properties of the magnetic field sensed by one or both sub-sensors, and stores the one or more properties in memory 402, typically a digital value proportional to a voltage produced by the second sub-sensor 406. The magnetic field properties may include properties produced by other magnetic sources.

At block 524, processor 400 determines one or more threshold values, in one embodiment, based on the readings taken during the configuration mode, at block 514, and the magnetic field value(s) stored in memory 402, determined at block 522, for use in determining whether a door or window has been opened, or whether a door or window has opened more than a predetermined amount.

At block 526, processor 400 stores the one or more alarm threshold values in memory 402.

At block 528, status indicator 212 may provide an indication to the user that the alarm threshold value(s) has/have been calculated and/or that near-far sensor 200 is ready for use.

At block 530, near-far sensor 200 enters a normal operation mode, where it monitors the selected sub-sensor(s) to determine if a monitored door or window has opened. This may occur automatically, or it may be entered by the user manually entering normal mode via user interface 210.

At block 532, processor 400 monitors the selected sub-sensor to detect a change in the magnetic field sensed by the selected sub-sensor, or monitors both sub-sensors at different rates, as described previously. When a change is detected, or a change that exceeds one or more thresholds stored in memory 402, then processor 400 generates an alarm signal, indicating that the monitored door or window has been opened. Similarly, if an anomaly is detected, for example, no change in a selected primary sub-sensor but a change in secondary sub-sensor, processor 400 may cause an anomaly signal to be transmitted to alarm panel 112.

At block 534, alarm panel 112 receives the alarm signal and/or anomaly signal and, in response, causes one or more actions to occur, including sounding an audible alert at alarm panel 112, illuminating one or more lights at alarm panel 112, providing an indication as to which near-far sensor 200 is providing the alarm signal, and/or transmitting an indication of the alarm signal to remote monitoring facility.

The methods or algorithms described in connection with the embodiments disclosed herein may be embodied directly in hardware or embodied in processor-readable instructions executed by a processor. The processor-readable instructions may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components.

Accordingly, an embodiment of the invention may comprise a computer-readable media embodying code or processor-readable instructions to implement the teachings, methods, processes, algorithms, steps and/or functions disclosed herein.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

I claim:

1. A near-far security sensor for monitoring a barrier, comprising:
   a first sub-sensor for detecting a magnetic field produced by a magnet associated with the barrier;
   a second sub-sensor for detecting the magnetic field produced by the magnet associated with the barrier;
   a transmitter;
   a memory for storing processor-executable instructions; and
   a processor coupled to the first sub-sensor, the second sub-sensor, the transmitter and the memory for executing the processor-executable instructions that cause the near-far sensor to:
      monitor, by the processor, both the first sub-sensor and the second sub-sensor during a normal operating mode;
      determine, by the processor, that either the first sub-sensor or the second sub-sensor has provided a signal indicative of the barrier being moved; and
      cause, by the processor, an alarm signal to be transmitted by the transmitter when the processor determines that the barrier has been moved based on the signal from either the first sub-sensor or the second sub-sensor.

2. The near-far security sensor of claim 1, wherein the processor-executable instructions comprise further instructions that cause the near-far sensor to:
   determine, by the processor, that the signal is received only from the first sub-sensor; and
   in response to determining that the signal is received only from the first sub-sensor, monitor, by the processor, only the first sub-sensor.

3. The near-far security sensor of claim 2, wherein the processor-executable instructions comprise further instructions that cause the near-far sensor to:
   stop monitoring the second sub-sensor.

4. The near-far security sensor of claim 3, wherein the processor-executable instructions comprise further instructions that cause the near-far sensor to:
   periodically monitor, by the processor, the second sub-sensor to determine whether the sensor has been tampered with.

5. The near-far security sensor of claim 4, wherein the processor-executable instructions comprise further instructions that cause the near-far sensor to:
   determine, by the processor, that tampering has occurred when the first sub-sensor does not indicate that the barrier has been moved and when the processor determines that the second sub-sensor detected the presence of a second magnetic field produced by a second magnet held by an intruder.

6. The near-far security sensor of claim 1, wherein the processor-executable instructions comprise further instructions that cause the near-far sensor to:
   cause, by the processor, the near-far security sensor to enter into a configuration mode of operation from the normal operating mode;
   monitor, by the processor, the first sub-sensor and the second sub-sensor as the barrier is placed into a closed position;
   determine, by the processor, that one of the sub-sensors has detected the magnetic field; and
   select, by the processor, the sub-sensor that detected the magnetic field for monitoring during the normal operating mode.

7. The near-far security sensor of claim 6, wherein the processor-executable instructions comprise further instructions that cause the near-far sensor to:
   determine that the first sub-sensor is first to provide the signal during the configuration mode; and
   when the first sub-sensor detects the magnetic field first, select the first sub-sensor only for monitoring during the normal operating mode.

8. The near-far security sensor of claim 1, wherein the first sub-sensor comprises a reed switch and wherein the processor-executable instructions comprise further instructions that cause the near-far sensor to:
   cause, by the processor, the near-far security sensor to enter into a configuration mode of operation from the normal operating mode;
   monitor, by the processor, the reed switch and the second sub-sensor as the barrier is placed into a closed and an open position;
   determine, by the processor, that both the reed switch and the second sub-sensor detected the magnetic field; and
   select, by the processor, the reed switch only for future monitoring by the processor when both the reed switch and the second sub-sensor detected the magnetic field.

9. The near-far security sensor of claim 1, wherein the first sub-sensor comprises a first magnetic field sensitivity and the second sub-sensor comprises a second magnetic field sensitivity, wherein the second magnetic field sensitivity is at least five times more sensitive than the first magnetic field sensitivity.

10. The near-far security sensor of claim 1, wherein the first sub-sensor comprises a reed switch and the second sub-sensor comprises a Hall effect sensor.

11. The near-far security sensor of claim 1, wherein the first sub-sensor comprises a reed switch and the second sub-sensor comprises a magneto resistor.

12. A method performed for monitoring a barrier by a near-far security sensor, comprising:
monitoring, by a processor, both a first sub-sensor coupled to the processor and a second sub-sensor coupled to the processor during a normal operating mode;
determining, by the processor, that either the first sub-sensor or the second sub-sensor has provided a signal indicative of the barrier being moved; and
causing, by the processor, an alarm signal to be transmitted by the transmitter when the processor determines that the barrier has been moved based on the signal from either the first sub-sensor or the second sub-sensor.

13. The method of claim 12, further comprising:
determining, by the processor, that the signal is received only from the first sub-sensor; and
in response to determining that the signal is received only from the first sub-sensor, monitoring, by the processor, only the first sub-sensor.

14. The method of claim 13, further comprising:
stopping monitoring of the second sub-sensor.

15. The method of claim 14, further comprising:
periodically monitoring, by the processor, the second sub-sensor to determine whether the sensor has been tampered with.

16. The method of claim 15, further comprising:
determining, by the processor, that tampering has occurred when the first sub-sensor does not indicate that the barrier has been moved and when the processor determines that the second sub-sensor detected the presence of a second magnetic field produced by a second magnet held by an intruder.

17. The method of claim 12, further comprising:
causing, by the processor, the near-far security sensor to enter into a configuration mode of operation from the normal operating mode;
monitoring, by the processor, the first sub-sensor and the second sub-sensor as the barrier is placed into a closed position;
determining, by the processor, that one of the sub-sensors has detected the magnetic field; and
selecting, by the processor, the sub-sensor that detected the magnetic field for monitoring during the normal operating mode.

18. The method of claim 17, further comprising:
determining that the first sub-sensor is first to provide the signal during the configuration mode; and
when the first sub-sensor detects the magnetic field first, selecting the first sub-sensor only for monitoring during the normal operating mode.

19. The method of claim 12, wherein the first sub-sensor comprises a reed switch, the method further comprising:
causing, by the processor, the near-far security sensor to enter into a configuration mode of operation from the normal operating mode;
monitoring, by the processor, the reed switch and the second sub-sensor as the barrier is placed into a closed and an open position;
determining, by the processor, that both the reed switch and the second sub-sensor detected the magnetic field; and
selecting, by the processor, the reed switch only for future monitoring by the processor when both the reed switch and the second sub-sensor detected the magnetic field.

20. The method of claim 12, wherein the first sub-sensor comprises a first magnetic field sensitivity and the second sub-sensor comprises a second magnetic field sensitivity, wherein the second magnetic field sensitivity is at least five times more sensitive than the first magnetic field sensitivity.

21. The method of claim 12, wherein the first sub-sensor comprises a reed switch and the second sub-sensor comprises a Hall effect sensor.

22. The method of claim 12, wherein the first sub-sensor comprises a reed switch and the second sub-sensor comprises a magneto resistor.

* * * * *